United States Patent [19]

Nulman

[11] Patent Number: 5,754,297
[45] Date of Patent: May 19, 1998

[54] METHOD AND APPARATUS FOR MONITORING THE DEPOSITION RATE OF FILMS DURING PHYSICAL VAPOR DEPOSITION

[75] Inventor: Jaim Nulman, Palo Alto, Calif.

[73] Assignee: Applied Materials, Inc., Santa Clara, Calif.

[21] Appl. No.: 839,419

[22] Filed: Apr. 14, 1997

Related U.S. Application Data

[63] Continuation of Ser. No. 724,038, Sep. 23, 1996, abandoned, which is a continuation of Ser. No. 544,362, Oct. 17, 1995, abandoned, which is a continuation of Ser. No. 187,956, Jan. 28, 1994, abandoned.

[51] Int. Cl.$^6$ .................................................. G01B 11/06
[52] U.S. Cl. .................... 356/381; 250/559.27; 438/16; 427/10
[58] Field of Search .................................. 356/381, 382, 356/432, 433, 436, 437; 156/601, 612; 427/8–10, 566, 567, 248.1–255.7; 118/708, 712, 620

[56] References Cited

U.S. PATENT DOCUMENTS

| | | | |
|---|---|---|---|
| 3,373,278 | 3/1968 | Cilyo | 427/8 |
| 3,654,109 | 4/1972 | Hohl et al. | 427/8 |
| 3,804,532 | 4/1974 | Patten et al. | |
| 3,892,490 | 7/1975 | Uetsuki et al. | 356/382 |
| 4,049,352 | 9/1977 | Lardon et al. | 427/10 |
| 4,166,784 | 9/1979 | Chapin et al. | 204/192 R |
| 4,208,240 | 6/1980 | Lasto | 356/381 |
| 4,381,894 | 5/1983 | Gogol, Jr. et al. | 356/72 |
| 4,456,379 | 6/1984 | Schumann et al. | |
| 4,469,713 | 9/1984 | Schwiecker et al. | 427/8 |
| 4,478,173 | 10/1984 | Doehler | 427/8 |
| 4,711,790 | 12/1987 | Morishige | 427/10 |
| 4,894,132 | 1/1990 | Tanaka | 204/192.13 |
| 5,009,485 | 4/1991 | Hall | |
| 5,032,435 | 7/1991 | Biefeld et al. | 427/8 |
| 5,154,810 | 10/1992 | Kamerling et al. | |

FOREIGN PATENT DOCUMENTS

| | | | |
|---|---|---|---|
| 0416251 | 3/1991 | European Pat. Off. | |
| 0452665 | 10/1991 | European Pat. Off. | |
| 0166503 | 10/1982 | Japan | 356/382 |
| 59-74635 | 4/1984 | Japan | |
| 210147 | 8/1989 | Japan | |
| 492444 | 3/1992 | Japan | |

OTHER PUBLICATIONS

Patent Abstracts of Japan, vol. 013, No. 125 (P–847), 28 Mar. 1989 & JP–A–63 295907 (Mitsubishi Electric Corp.) 2 Dec. 1988.

Patent Abstracts of Japan, vol. 014, No. 349 (P–1084), 27 Jul. 1990 & JP–A–02 124406 (Mitsubishi Electric Corp.) 11 May 1990.

Patent Abstracts of Japan, vol. 011, No. 249 (E–532), 13 Aug. 1987 & JP–A–62 062513 (Fujitsu Ltd.) 19 Mar. 1987.

Patent Abstracts of Japan, vol. 014, No. 128 (P–1019), 9 Mar. 1990 & JP–A–01 320408 (Nippon Steel Corp.) 26 Dec. 1989.

*Primary Examiner*—Hoa Q. Pham
*Attorney, Agent, or Firm*—William Konrad

[57] ABSTRACT

A deposition rate monitor based on the measurement of optical attenuation is described for use in deposition equipment such as sputtering systems used to deposit thin metal films on semiconductor devices. A beam of light is passed through the region between a deposition source and the deposition substrate. The beam of light is attenuated by the material being transported from the source to the substrate before the light is detected at a detector. The level of attenuation of the light passing through the deposition environment can be empirically related to the rate at which material is being deposited on the substrate. The optical absorption deposition rate monitor can be used to adjust processing variables to maintain a constant deposition rate.

30 Claims, 3 Drawing Sheets

METHOD AND APPARATUS FOR MONITORING THE DEPOSITION RATE OF FILMS DURING PHYSICAL VAPOR DEPOSITION

This is a continuation of application Ser. No. 08/724,038, filed Sep. 23, 1996, now abandoned, which is a continuation of Ser. No. 08/544,362 filed Oct. 17, 1995, now abandoned, which is a continuation of application Ser. No. 08/187,956 filed on Jan. 28, 1994, now abandoned.

FIELD OF THE INVENTION

The present invention relates to the deposition of films and, more particularly, to monitoring the deposition of films.

BACKGROUND OF THE INVENTION

The diminished size of structures in modern semiconductor devices places extreme demands on semiconductor processing equipment. One answer to these demands is to improve process monitoring and to implement improved process control based on the process monitoring. In situ process monitoring allows the progression of process steps to be monitored to ensure that process variables such as input power, gas pressure, source age, and others are properly compensated to ensure consistent processing results. Increasing the level of process monitoring also reduces costs. Because of the complexity of semiconductor devices and the number of devices formed on each wafer, each wafer start represents a substantial investment. It is therefore often desirable to monitor the progress of critical wafer processing steps to ensure that the steps are properly completed.

One of the important process steps in semiconductor device processing, as well as in other types of device processing, is the deposition of metal films. Deposited metal films are formed into interconnect lines, bus structures, Schottky barriers, ohmic contacts or other device structures. Deposition of an appropriate thickness of metal film is generally important to the performance of the interconnect lines or other devices formed from the metallic layers. If too thin a metal film is deposited, an interconnect line formed from that film may be unacceptably resistive or may have a greater likelihood of becoming an open circuit either during subsequent processing steps or during the normal operation of the device. The deposition of unnecessarily thick metal films is also undesirable because the film deposition takes longer than is necessary and the film thickness may be in excess of the tolerances of later processing steps. Accordingly, it is desirable to maintain metal film thicknesses near their optimal levels. Because the variation of some process variables cannot be accurately predicted over the course of many process runs, it is desirable to utilize an in situ process monitoring system.

One type of thickness monitor that has been used to monitor the deposition of film layers is a thickness monitor based on a quartz oscillator. In such thickness monitors, a quartz oscillator is placed adjacent to the substrate upon which material is being deposited. As material is deposited on the substrate, metal is also deposited on the quartz oscillator. Material accumulating on the quartz oscillator changes the mass of the oscillator and, consequently, the resonant frequency of the oscillator. By electrically detecting the variation in the resonant frequency of the oscillator, the total amount of material deposited on the exposed surface of the oscillator can be calculated. Quartz oscillators often fail, resulting in a lack of process information during that process run and requiring that the thickness monitor be replaced, resulting in unacceptable down time for the semiconductor processing equipment. Moreover, even if a quartz oscillator functions reliably, it becomes increasingly less sensitive with continued usage and eventually fails to function as a thickness monitor. Finally, quartz oscillators typically do not sample the thickness of material deposited on the deposition substrate; instead, such oscillators sample the deposition of material adjacent to the substrate.

SUMMARY OF THE PREFERRED EMBODIMENTS

In accordance with one aspect of the present invention, a deposition rate monitor includes a deposition substrate and a light source for directing light over the deposition substrate. An optical detector is disposed to receive the light after the light passes above the deposition substrate.

In accordance with another aspect of the present invention, a deposition rate can be monitored by passing a beam of light above the substrate upon which material is being deposited. The intensity of the beam of light is measured after it passes above the deposition substrate while no material is being deposited on the deposition substrate. The intensity of the beam of light is measured a second time while material is being deposited on the substrate.

DETAILED DESCRIPTION OF THE PREFERRED EMBODIMENTS

The present invention relates to a method and an apparatus for monitoring a deposition rate. A deposition rate monitor in accordance with the present invention is preferably based on the attenuation of a signal passed above a deposition substrate during deposition. Particularly preferred embodiments of the present invention may be implemented in a processing system to measure the rate of deposition of films onto a deposition substrate. In preferred embodiments of the present invention, a light source directs light through the region between a deposition source and the deposition substrate, and onto an optical detector. Light passing through the region between the deposition source and substrate is attenuated by the presence of particulate matter being transported from the source to the substrate. The amount of attenuation is related to the rate at which material is flowing from the deposition source to the deposition substrate.

Metal films can be deposited, for example, by chemical vapor deposition (CVD) or by physical vapor deposition (PVD). PVD is a general term which includes both evaporation and sputtering techniques. In the sputter deposition of metal films, a target comprising the metal to be deposited is disposed above the substrate on which the metal film is to be deposited. The sputtering target is typically coupled to either a DC or radio frequency (RF) power supply capable of applying a negative voltage to the target. Generally, a gas in which a glow discharge can be maintained is introduced into the region between the target and the deposition substrate. Often, argon is used as the glow discharge medium. A glow discharge is established in the region between the sputtering target and the deposition substrate. Positive ions from the glow discharge region accelerate into the target, striking the target with sufficient momentum to cause metal molecules or atoms to be ejected from the surface of the target. Metal atoms from the target condense on the deposition substrate, forming a film of metal on the surface of the deposition substrate.

Figure 1:
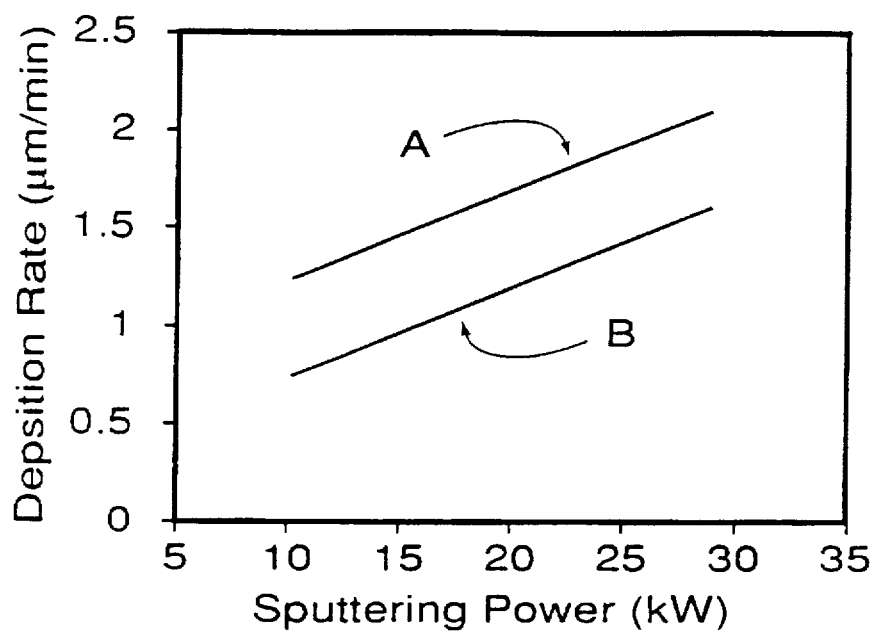
FIG. 1 illustrates deposition rates achieved at different input powers for deposition system having an aging sputtering target.

Targets used for the sputter deposition of thin films experience an aging effect. For example, the deposition rate that can be obtained at a given input power level has been observed to decrease with increasing target age. FIG. 1 illustrates this phenomenon. FIG. 1 shows the dependence of the deposition rate on the level of power input to the sputtering source at different times in the lifetime of the target. Curve A shows the deposition rate achieved at varying power levels for a new target; curve B illustrates the deposition rates achieved for a target near the end of its life. Two important points emerge from FIG. 1. First, critical processing characteristics, such as the deposition rate, may vary from run to run for a given piece of processing equipment in ways that can affect the yield and quality of devices processed in that deposition system. Second, by measuring processing characteristics in situ within the deposition system and by adjusting processing variables, such as the power input to the sputtering source, in response to the observed variations in processing characteristics, the processing characteristics of the deposition system can more readily be maintained near desired levels.

Figure 2:
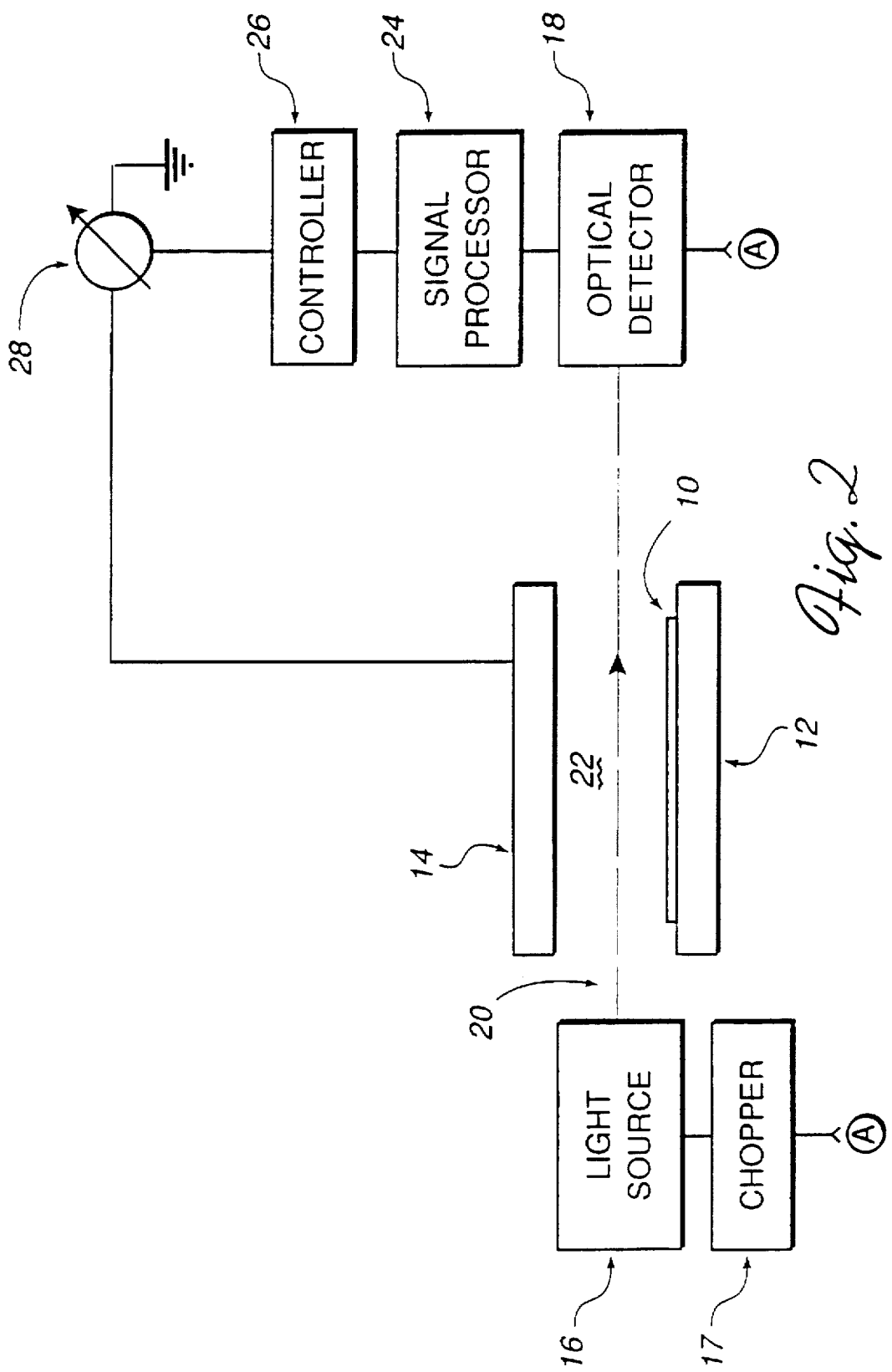
FIG. 2 shows a deposition rate monitor in accordance with a preferred embodiment of the present invention.

To this end, preferred embodiments of the present invention may be used to monitor the deposition of films within processing equipment. For example, preferred embodiments of the present invention may be used to measure the rate at which metal film layers are deposited on the surface of a semiconductor device during the deposition of such metal films. One preferred embodiment is shown in FIG. 2. FIG. 2 illustrates an exemplary processing environment and, in particular, is a schematic illustration of a physical vapor deposition system. A deposition substrate 10 is disposed on a support 12 and is preferably placed parallel to a deposition source 14. Deposition occurs by the transfer of material from the deposition source 14 to the surface of the deposition substrate 10. Power is input to the deposition source 14 from a power supply 28 that is preferably controlled by controller 26. An example of a sputter deposition system is the Endura 5500 available from Applied Materials, Inc., of Santa Clara, Calif. Wang describes a sputter deposition system in U.S. Pat. No. 5,105,570.

A light source 16 directs light, indicated by 20 in FIG. 2, through the region 22 between the deposition substrate 10 and the deposition source 14. The light 20 passes through the region 22 between the deposition substrate and the deposition source to an optical detector 18 positioned to collect the light 20 passing through the region 22. By comparing the intensity of light 20 collected by detector 18 during deposition with the intensity of light 20 collected by the optical detector 18 before the deposition process, begins, embodiments of the present invention are capable of monitoring the rate at which material is deposited.

The processing system illustrated in FIG. 2 deposits films by transferring material from the deposition source 14 to the deposition substrate 10. In practice, material transported from the surface of the deposition source 14 can take a variety of forms, depending on the particular material being deposited and the deposition technique being employed. For example, in the sputter deposition of aluminum films, aluminum molecules are transported across the region 22 from the sputtering target 14 to the deposition substrate 10. Under the deposition conditions typical for many processing systems, the present inventor has observed that visible light is attenuated by the particulate matter which passes from the source 14 to the substrate 10 and which passes through the region 22 during deposition. Based on these observations, it is believed that the amount by which light is attenuated is a function of the density of particulate matter travelling from the source 14 to the substrate 10 at the time that the attenuation measurement is made.

Figure 3:
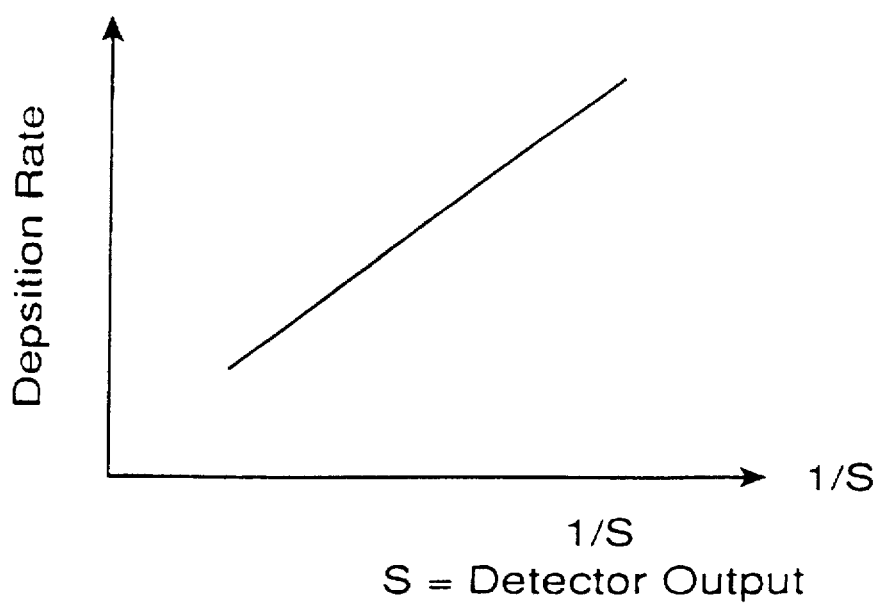
FIG. 3 is a schematic illustration of a relationship between the deposition rate and the output signal from the optical detector.

Determining an absolute deposition rate from the level of optical attenuation is difficult because of the number of process variables involved. It is generally far more practical to establish an empirical relationship between the observed attenuation and the deposition rate. This may be established for a particular type of deposition process being performed in a given deposition geometry. In other words, the relationship between the observed attenuation and the deposition rate may be empirically determined for the deposition of one type of material in a given model of processing equipment. A relationship between a film deposition rate and the signal output by optical detector 18 is illustrated schematically in FIG. 3. Relationships such as this should be developed on an empirical basis for particular deposition materials and deposition geometries. Alternately, it may be preferred to establish the relationship between the optical absorption and the deposition rate for an individual piece of processing equipment and material being deposited. This sort of calibration would typically be performed in the normal operating environment of both the processing equipment and the optical attenuation rate monitor. The calibration would preferably be repeated whenever major service is performed on the processing equipment, or as such recalibration becomes necessary.

A determination of the absolute value of the deposition rate is not necessary to the use of the present deposition rate monitor. For example, one possible application of the present system is to monitor the variation of the deposition rate caused by the aging of the sputtering target in a sputter deposition system. The effect of target aging on deposition rate in such a system is illustrated in FIG. 1, discussed above. In a sputtering system which exhibits target aging effects, the decrease in target efficiency will be mirrored by a similar decrease in the density of particulate matter in region 22 (FIG. 2) at given input power level. This decrease in the particulate density can be accurately tracked by monitoring the relative or proportional decrease in the measured relative optical attenuation. In preferred embodiments of the present invention, signal processor 24 may store information related to the optical attenuation observed for a typical new deposition source, such as that indicated schematically in FIG. 3, or it may store the operational history of a particular deposition source. Later attenuation measurements can be compared with earlier "baseline" data within signal processor 24. In particularly preferred embodiments of the present invention, data from the signal processor 24 can be supplied to the controller 26 to form a closed-loop control system. Thus, the controller 26 adjusts the power input from power supply 28 to target 14 to compensate for target aging.

All of the information necessary to accurately track the phenomenon illustrated in FIG. 1 can be derived by monitoring the variation of the optical attenuation at fixed processing conditions as the target ages. These measurements preferably yield the current deposition rate as a fraction or percentage of the deposition rate observed for a newly installed target. Accordingly, the optical attenuation of light passing through region 22 (FIG. 2) in the course of depositing material under a given set of processing conditions is preferably measured for a newly installed target. Subsequent depositions can be characterized by measuring the change in optical attenuation at the same processing conditions relative to the level of attenuation observed for a new target. This relative measurement can easily be incorporated into a closed-loop or other type of control system either coupled to or within the signal processor 24. For a system such as that characterized by the graph of FIG. 1, the power input to the sputtering system can be altered in response to variations in the relative optical attenuation to compensate for target aging effects. Thus, by controlling the relative optical attenuation so that it remains at a constant level, the run-to-run variations in the deposition rate can be minimized. In practice, the frequency of any necessary adjustments to processing conditions may vary. Accordingly, whether the constant monitoring and control that may be achieved with a closed-loop control system is necessary, or the deposition rate only needs to be monitored every few runs, will be determined by the level of process control desired.

Even within a given run, the deposition rate can be determined from a relative attenuation measurement. In a preferred embodiment of the present invention, variations in the optical system may be compensated by making optical absorption measurements relative to an initially measured value. Thus, run-to-run variations in the optical system such as misalignment or fouling of the optical surfaces can be compensated. Before deposition begins, the optical intensity is measured at the optical detector 18, which outputs a signal to a signal processor 24. The signal processor 24 stores a signal corresponding to the output of optical detector 18 for use in future measurements or calculations. All subsequent measurements are made in comparison to or as a ratio to this initial value. Variations in source intensity, either from run-to-run or within a given run, can be measured by including a beam splitter and a reference detector along the path of the light output by the source 16. Thus, the deposition rate monitor can measure and compensate for variations in the intensity of light output by the source 16.

Light source 16 is moss conveniently a laser. In practice, semiconductor lasers are very useful for the present invention because of their low cost, easy availability, the small size of the lasers and the ready availability of well-matched optical detectors. If there is an optical noise source, such as a glow discharge plasma or other high temperature black body, present within the processing environment, it is desirable to select a laser wavelength that is easily distinguished from the optical noise source. Alternately, a filter that is transmissive only at the wavelength of the laser light may be placed in front of the optical detector 18. In another alternate embodiment, the laser signal may be electrically or mechanically chopped, and signal detection can be synchronized at the chopping frequency. For example, an electrical chopper 17 may be used to modulate the light source 16 and the chopper 17 may supply a synchronization signal to the optical detector 18. As is generally the case with semiconductor lasers, it is typically desirable to maintain the laser at or near its optimum operating temperature in the course of operation. This is typically not difficult to achieve either by cooling the laser or by disposing the laser remote from the primary heat sources within the processing environment. Alternatively, a fiber optic device can be used to couple light from a semiconductor or other laser into the processing environment. Optical fibers are well suited for this purpose because optical fibers can readily be fitted into the high vacuum environments that are typically used in deposition systems.

If a laser having an appropriate wavelength is not available, a suitable input light signal can be formed from a broadband light source such as a tungsten halogen lamp. If it is desirable to avoid a particular noise source wavelength or an absorption line in the processing environment, a narrow wavelength range can be selected from the light output using a narrow bandpass filter in front of the light source. Either filter or grating can be used to select a narrow wavelength range to form the light signal directed through the region 22 between the deposition source 14 and the substrate 10. A similar filter or grating may also be placed along the optical path between region 22 and the optical detector 18. In the alternative, a broad spectrum input light source can be directed into the deposition region, and a narrow filter or grating can be placed between the optical detector and the deposition region.

It is generally desirable to use an optical detector 18 that is wavelength compatible with the light source 16. A variety of optical detectors are available, and any suitable detector may be used. For example, a large area photodiode may be preferred to minimize potential alignment problems. To aid in signal detection, it is preferable to mechanically or electrically chop the light source 16 and to synchronize the optical detector with the chopper. Chopping may not be necessary in systems where there is little optical noise in the deposition environment.

The deposition substrate 10 may be, for example, a silicon wafer undergoing integrated circuit device processing, or the substrate might be a glass substrate for use in liquid crystal displays, or another type of deposition substrate. Support 12 may be an electrostatic chuck, vacuum chuck, or other of the support devices well known in the art of processing equipment. For example, the support 12 may be a plate that is adapted for use with a clamp ring or with spring clips to hold a semiconductor wafer in place. Deposition source 14 may be an evaporation source or a sputtering target. The deposition rate monitor of the present invention is generally more easily implemented in physical vapor deposition systems because there is relatively little difficulty in ensuring that optical surfaces are adequately protected in the processing environment. However, it is possible to use a deposition rate monitor in accordance with the present invention in a chemical vapor deposition system, although it may be undesirable if photochemical reactions take place in the particular CVD system that is of interest. Optical surfaces in chemical vapor deposition systems generally must be protected by cooling or by flowing inert gas over the optical surface. It may be desirable to operate a deposition rate monitor in accordance with the present invention in a pulse mode to minimize any photochemical deposition on optical surfaces. In a chemical vapor deposition system, the deposition source 14 may be a "shower head" source of ions, or it may be the anode of a glow discharge (CVD) system.

In a particularly preferred embodiment of the present invention, a deposition rate monitor can be used as a process monitor for the deposition of thin metal films by physical vapor deposition. For example, the deposition rate monitor may be used in a sputtering system for the deposition of metal films. To facilitate the understanding of the following discussion, structures shown in FIG. 4 and discussed herein that are similar to structures illustrated in FIG. 2 are identified by the same numerals in FIG. 4. In the embodiment illustrated in FIG. 4, metal molecules or atoms are ejected from the target 14 and are deposited on the surface of substrate 10. The deposition substrate may be, for example, a silicon wafer on which integrated circuits are being formed. Light source 16 directs a beam of light off of a first mirror 32, or off of an assembly of mirrors, toward the region 22 between the sputtering target 14. The beam of light 20 is incident on a second mirror 34, or on an assembly of mirrors, before it is incident on the detector 34. Both light source 16 and linear optical detector 18 are, in this embodiment, remotely disposed from the sputtering environment. In this way, the operating temperatures of these components may be optimized and the possibility of depositing material on these components is minimized.

Figure 4:
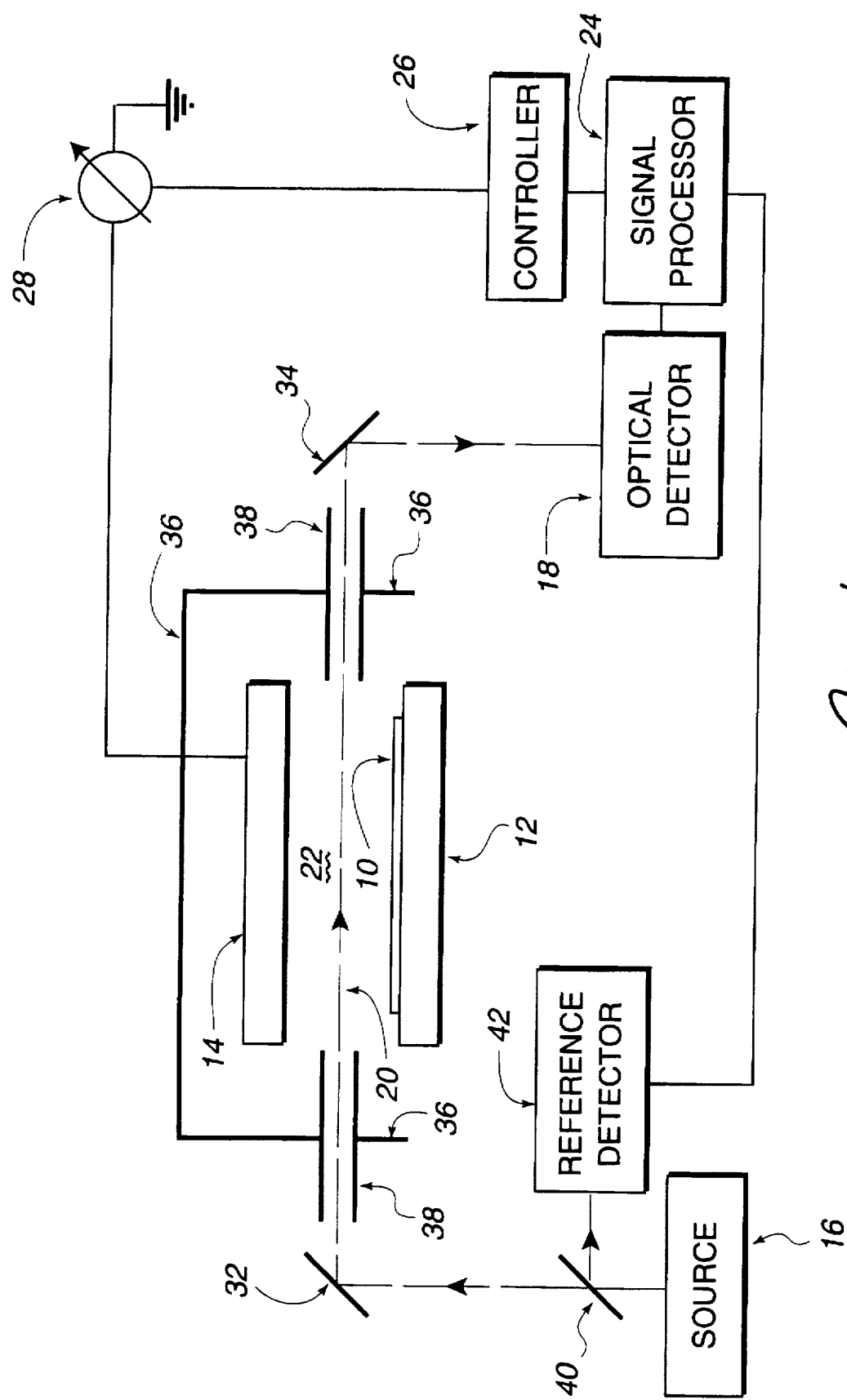
FIG. 4 shows another embodiment of the present invention.

A deposition rate monitor in accordance with the present invention can be used for process control in a physical vapor deposition system such as that illustrated by FIG. 4. For example, the optical attenuation associated with deposition under a particular set of processing conditions may be compared against a value of attenuation corresponding to a new deposition source. The variations in the deposition rate over the life of a deposition source can then be compensated for by, for example, increasing the level of RF power input to the deposition source. By monitoring the deposition rate on a periodic basis, thin film deposition characteristics can be maintained near a constant level over the life of a deposition source. Typically, the deposition rate monitor will be coupled to or integrated with the control systems within the physical vapor deposition system. Process variables other than target aging may similarly be monitored and compensated for if they affect the thin film deposition rate.

A shield 36 may be disposed so as to encompass the sputtering region, as generally indicated in FIG. 4. Long and narrow optical ports 38 extend from the walls of the shield 36 to block the passage of sputtered material and to shield optical surfaces exterior to the shield 36 from line of sight exposure to the sputtering target 14. Physical vapor deposition sources deposit material primarily along a line of sight path from the source. Accordingly, if optical surfaces are not exposed to line of sight exposure from the sputtering target 14, little sputtered material is deposited on the optical surfaces, and the useful lifetime of the optical absorption thickness monitor is prolonged. This general strategy may also be employed for deposition rate monitors implemented in other types of deposition systems.

Also illustrated in FIG. 4 is a beam splitter 40 and a reference detector 42 disposed along the optical path from the light source 16 to region 22. For systems in which the output intensity of light source 16 varies enough to interfere with data collection over the course of a run, the beam splitter 40 and reference detector 42 may be included to compensate for variations in the output intensity of light source 16. Beam splitter 40 splits off a portion of the light produced by light source 16 and directs the split off light to a reference detector 42. The output of detector 42 may be coupled to a light source control system that alters the optical power output by the light source 16 to maintain the output light power at a constant level.

Alternately, the reference detector 42 may be used as a reference to which the output of optical detector 18 is either compared or ratioed. In such an embodiment, the output of reference detector 42 is preferably coupled to the signal processor 24 (not shown). This embodiment of the present invention will also serve to compensate for unintentional variations in the power output by light source 16. In addition, this system can be used to compensate for intentional variations in the power output by the laser. If the density of particulate matter in the region 22 becomes sufficiently high, it may be necessary to increase the power output by light source 16 to obtain a sufficient optical signal at the detector 18 to measure the optical attenuation. Altering the power input to the system can be adjusted for without recalibration through the use of detector 42 as a reference to which the signal output by the optical detector 18 is either compared or ratioed.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A deposition rate monitor comprising:
    a fixture adapted to hold a deposition substrate;
    a light source which directs light over said fixture;
    an optical detector disposed to receive said light after said light passes over said fixture, wherein said optical detector produces a first signal prior to initiation of a deposition process and wherein said optical detector produces a second signal during a deposition process; and
    a signal processor which stores a first measured value of said second signal obtained during said deposition process, said signal processor comparing a subsequently measured value of said second signal obtained during a subsequent deposition process to said first measured value.

2. A deposition rate monitor in accordance with claim 1 further comprising a semiconductor wafer as a deposition substrate.

3. A deposition rate monitor in accordance with claim 1 wherein said light source comprises a semiconductor laser.

4. A deposition rate monitor in accordance with claim 1 further comprising means for forming a ratio between said second signal and said first signal.

5. A deposition rate monitor in accordance with claim 1 further comprising a control system that adjusts deposition parameters in response to said first and said second measured values produced by said optical detector.

6. A physical vapor deposition system having a processing environment, which has at least one characteristic absorption line, comprising:
    a fixture adapted to hold a semiconductor wafer;
    a physical vapor deposition source disposed adjacent to said fixture, said physical vapor deposition source providing material to be deposited;
    a light source which directs light through a region between said source and said fixture, wherein said light source emits light at a wavelength range that avoids said at least one characteristic absorption line of the processing environment; and
    an optical detector disposed to receive said light after said light passes over said fixture, wherein said optical detector produces a first signal prior to initiation of a deposition process and wherein said optical detector produces a second signal during said deposition process.

7. A physical vapor deposition system according to claim 6 wherein said deposition source is a sputtering target.

8. A physical vapor deposition system according to claim 6 further comprising a shield disposed around said fixture and said deposition source, said shield having at least one optical port, wherein said light passes through said at least one optical port.

9. A physical vapor deposition system according to claim 8 further comprising:

a first mirror disposed so as to direct said light toward said fixture; and a second mirror disposed so as to direct said light toward said optical detector.

10. A physical vapor deposition system according to claim 6 further comprising a control system that adjusts deposition parameters in response to said second signal generated by said optical detector.

11. A physical vapor deposition system according to claim 10 further comprising a power supply coupled to said deposition source, wherein said power supply is coupled to and is at least partially controlled by said control system.

12. A physical vapor deposition system in accordance with claim 6 further comprising means for forming a ratio between said second signal and said first signal.

13. A physical vapor deposition system in accordance with claim 12 further comprising a control system that adjusts deposition parameters in response to said first and said second signal produced by said optical detector.

14. A method of depositing material on a substrate comprising the steps of:

providing a deposition substrate to a deposition environment;

passing a beam of light over said deposition substrate;

measuring a first intensity of said beam of light while no material is being deposited on said deposition substrate;

sputter depositing a film of material on said deposition substrate from a target in which the rate of sputtering is a function of said target's age;

measuring a second intensity of said beam of light while said material is being deposited on said substrate;

comparing said second intensity with said first intensity to generate data characteristic of a density of material within said deposition environment; and comparing said data characteristic of said density of material within said deposition environment with predetermined data characteristic of the density of material within a deposition environment to determine a variation of said density of material within said deposition environment caused by aging of said target.

15. A method in accordance with claim 14 further comprising the step of calculating a deposition rate from said first intensity and said second intensity.

16. A method in accordance with claim 14 further comprising the steps of passing said beam of light through a first optical port and through a second optical port.

17. A deposition rate monitor comprising:

a fixture adapted to hold a deposition substrate so that said deposition substrate is exposed to a deposition transport region through which deposition material is transported during a deposition process;

a light source which directs light through said deposition transport region;

an optical detector disposed to receive said light after said light has passed through said deposition transport region, wherein said optical detector generates a signal indicative of a density of material within said deposition transport region; and a signal processor coupled to receive said signal from said optical detector; wherein said signal processor stores an initially measured value of said signal obtained during said deposition process, said signal processor comparing a subsequently measured value of said signal obtained during a subsequent deposition process to said initially measured value to generate a signal characteristic of a change in said density of material within said deposition transport region as a function of time.

18. A deposition rate monitor in accordance with claim 17 wherein said fixture is adapted to hold a semiconductor wafer.

19. A deposition rate monitor in accordance with claim 17 wherein said light source comprises a semiconductor laser.

20. A deposition rate monitor in accordance with claim 17 further comprising means for determining a deposition rate from said signal indicative of a density of material within said deposition transport region.

21. A deposition rate monitor in accordance with claim 20 wherein said means for determining a deposition rate generates a measured deposition rate signal based on an empirically derived relationship between an attenuation of said light received by said optical detector and a previously measured deposition rate.

22. A deposition rate monitor in accordance with claim 17 further comprising a control system for adjusting a deposition parameter in accordance with said signal indicative of a density of material within said deposition transport region.

23. A physical vapor deposition system having a processing environment which has at least one characteristic absorption line, comprising:

a fixture adapted to hold a deposition substrate;

a physical vapor deposition source disposed in relation to said fixture so as to define a deposition transport region through which deposition material is transported during a physical vapor deposition process;

a light source which directs light through said deposition transport region;

an optical detector disposed to receive said light after said light has passed through said deposition transport region, wherein said optical detector generates a signal indicative of a deposition rate; and a filter disposed between said light source and said optical detector, said filter selecting at least one wavelength range to avoid said at least one characteristic absorption line of the processing environment.

24. A physical vapor deposition system in accordance with claim 23 further comprising means for determining a deposition rate from said signal indicative of a deposition rate.

25. A physical vapor deposition system in accordance with claim 24 wherein said means for determining a deposition rate generates a measured deposition rate signal based on an empirically derived relationship between an attenuation of said light received by said optical detector and a previously measured deposition rate.

26. A physical vapor deposition system in accordance with claim 25 further comprising a control system for adjusting a deposition parameter in accordance with said signal indicative of a deposition rate.

27. A physical vapor deposition system in accordance with claim 23 further comprising a shield disposed around said fixture and said deposition source, said shield having at least one optical port, wherein said light passes through said at least one optical port.

28. A method of depositing material on a substrate comprising the steps of:

providing a deposition substrate to a deposition environment so that at least one surface of said deposition substrate is exposed to a deposition transport region through which deposition material is transported during a deposition process, wherein said deposition process is characterized by generation of at least one wavelength range of optical noise signals;

passing a beam of light through said deposition transport region;

measuring an intensity of said beam of light while material is being deposited on said deposition substrate, said measuring being performed over at least one measurement range of wavelengths which do not include said at least one wavelength range of optical noise signals; and deriving a signal indicative of a density of material within said deposition transport region from said measured intensity.

29. The method of claim 28 further comprising the step of determining a deposition rate from said signal indicative of a density of material within said deposition transport region.

30. The method of claim 29 further comprising the step of adjusting a deposition parameter in accordance with said signal indicative of a deposition rate.

* * * * *